(12) United States Patent
Imai et al.

(10) Patent No.: US 10,158,056 B2
(45) Date of Patent: Dec. 18, 2018

(54) LED PACKAGE, LIGHT EMITTING DEVICE AND METHOD FOR MANUFACTURING LED PACKAGE

(71) Applicants: CITIZEN ELECTRONICS CO., LTD., Fujiyoshida-shi, Yamanashi (JP); CITIZEN WATCH CO., LTD., Tokyo (JP)

(72) Inventors: Sadato Imai, Yamanashi (JP); Masahide Watanabe, Fujiyoshida (JP); Hirohiko Ishii, Fujiyoshida (JP); Koki Hirasawa, Yamanashi (JP); Yuji Omori, Otsuki (JP)

(73) Assignees: Citizen Electronics Co., Ltd., Yamanashi (JP); Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 15/569,663

(22) PCT Filed: Feb. 9, 2016

(86) PCT No.: PCT/JP2016/053835
§ 371 (c)(1),
(2) Date: Oct. 26, 2017

(87) PCT Pub. No.: WO2016/174892
PCT Pub. Date: Nov. 3, 2016

(65) Prior Publication Data
US 2018/0123008 A1      May 3, 2018

(30) Foreign Application Priority Data
Apr. 27, 2015   (JP) .................................. 2015-090803

(51) Int. Cl.
*H01L 33/62*   (2010.01)
*H01L 23/48*   (2006.01)
(Continued)

(52) U.S. Cl.
CPC .............. *H01L 33/62* (2013.01); *H01L 23/48* (2013.01); *H01L 33/38* (2013.01); *H01L 33/44* (2013.01);
(Continued)

(58) Field of Classification Search
CPC .......... H01L 33/62; H01L 33/38; H01L 33/50
See application file for complete search history.

(56) References Cited

U.S. PATENT DOCUMENTS

2006/0055309 A1*  3/2006  Ono .................... H01L 25/0753
                                                          313/492
2006/0261364 A1* 11/2006  Suehiro .................. H01L 33/56
                                                          257/100
(Continued)

FOREIGN PATENT DOCUMENTS

JP       2003273160 A     9/2003
JP       2008021751 A     1/2008
(Continued)

OTHER PUBLICATIONS

Written Opinion for International Application No. PCT/JP2016/053835, dated Apr. 5, 2016, 5 pages.
(Continued)

*Primary Examiner* — Karen Kusumakar
(74) *Attorney, Agent, or Firm* — RatnerPrestia

(57) ABSTRACT

An LED package used in a light-emitting device is provided with a function of position correction in mounting by self-alignment, and mounting density of such LED packages is increased. The LED package includes an LED element including an element electrode on a bottom surface, a phosphor layer containing a phosphor and covering a top surface and a side surface of the LED element, and an auxiliary electrode having an upper face bonded to a lower face of the element electrode, wherein the auxiliary elec- (Continued)

trode is larger than the element electrode, the auxiliary electrode includes a step that makes a lower face smaller than the upper face, and an end portion of the auxiliary electrode on a side where the step is formed is located inside an outer peripheral side of the phosphor layer.

6 Claims, 7 Drawing Sheets

(51) Int. Cl.
H01L 33/44 (2010.01)
H01L 33/50 (2010.01)
H01L 33/38 (2010.01)

(52) U.S. Cl.
CPC .... *H01L 33/50* (2013.01); *H01L 2224/16245* (2013.01)

(56) References Cited

U.S. PATENT DOCUMENTS

2009/0200570 A1* 8/2009 Mori ................. H01L 33/642 257/99
2009/0321778 A1* 12/2009 Chen ................. H01L 24/81 257/99
2011/0186868 A1 8/2011 Watari et al.
2011/0260184 A1* 10/2011 Furuyama ........... H01L 33/38 257/98
2012/0302124 A1 11/2012 Imazu
2014/0284639 A1* 9/2014 Lin .................... H01L 33/62 257/98
2015/0316215 A1 11/2015 Togawa

FOREIGN PATENT DOCUMENTS

| JP | 2010267741 A | 11/2010 |
| JP | 2011129726 A | 6/2011 |
| JP | 2012074732 A | 4/2012 |
| JP | 5634647 B1 | 12/2014 |
| WO | 2011093454 A1 | 8/2011 |

OTHER PUBLICATIONS

International Search Report and Written Opinion for International Application No. PCT/JP2016/053835, dated Apr. 5, 2016—6 Pages.

* cited by examiner

LED PACKAGE, LIGHT EMITTING DEVICE AND METHOD FOR MANUFACTURING LED PACKAGE

CROSS REFERENCE TO RELATED APPLICATIONS

This is the U.S. National Phase application of PCT/JP2016/053835, filed Feb. 9, 2016, which claims priority to Japanese Patent Application No. 2015-090803, filed Apr. 27, 2015, the disclosures of these applications being incorporated herein by reference in their entireties for all purposes.

TECHNICAL FIELD OF THE INVENTION

The present invention relates to an LED package, a light-emitting device, and a method for manufacturing an LED package.

BACKGROUND OF THE INVENTION

For mounting semiconductor chips, there is known, for example, a method in which semiconductor chips are connected to electrodes on a substrate through protruding bump electrodes made of gold or solder. Specifically, there have been proposed semiconductor modules in which, through devising the shapes of the bump electrodes and the electrodes on the substrate, misalignment between positions of those electrodes is prevented during mounting.

For example, Patent literature 1 discloses a semiconductor-mounted module which includes a bare semiconductor chip provided with protruding bumps at terminals on the mounting side and a mounting substrate having connection electrodes connected to the bumps of the bare semiconductor chip, wherein recesses are provided at or above the connection electrodes of the mounting substrate for guiding the protruding bumps.

Patent literature 2 discloses a structure for connecting electrodes of a semiconductor chip, wherein protruding electrodes are formed on the semiconductor chip and electrodes having insertion openings are formed on a substrate and wherein the electrodes on the semiconductor chip are inserted into the insertion openings by being slid along the opening edges thereof in a direction directed to the center of each electrode on the substrate, so that the electrodes on the semiconductor chip are connected to the electrodes on the substrate.

CITATIONS LIST

Patent Literature

Patent literature 1: Japanese Unexamined Patent Publication (Kokai) No. 2003-273160
Patent literature 2: Japanese Unexamined Patent Publication (Kokai) No. 2008-021751

SUMMARY OF THE INVENTION

It is required for a light-emitting device including LED (light-emitting diode) packages as semiconductor chips to have the LED packages mounted on a substrate with high density in order to achieve high luminance. In general, even if a component is mounted on a substrate at a position shifted from a regular position, the position will be automatically corrected during reflow by a phenomenon called self-alignment if the misalignment amount is within the allowable range. In a case of a miniaturized LED package, however, since electrodes are particularly small relative to the package body and formed around the center of the bottom surface of the package, self-alignment may be less likely to occur and misalignment of the package position during mounting may be hard to be corrected. Therefore, for achieving the self-alignment effect, providing a larger auxiliary electrode on the LED package may be considered. However, when an auxiliary electrode is provided, the size of the LED package will be larger and it will be difficult to package LED packages with high density.

It is an objective of the present invention to provide an LED package used in a light-emitting device with a function of position correction in mounting by self-alignment, and to increase mounting density of such LED packages.

Provided is an LED package including an LED element including an element electrode on a bottom surface, a phosphor layer containing a phosphor and covering a top surface and a side surface of the LED element, and an auxiliary electrode having an upper face bonded to a lower face of the element electrode, wherein the auxiliary electrode is larger than the element electrode, the auxiliary electrode includes a step that makes a lower face smaller than the upper face, and an end portion of the auxiliary electrode on a side where the step is formed is located inside an outer peripheral side of the phosphor layer.

Preferably, in the above LED package, the LED element has a boxy shape, and the step of the auxiliary electrode is formed in both longitudinal and lateral directions of the boxy shape.

Further, provided is a light-emitting device including an LED element including an element electrode on a bottom surface, a phosphor layer containing a phosphor and covering a top surface and a side surface of the LED element, an auxiliary electrode having an upper face bonded to a lower face of the element electrode, and a mounting substrate having a conductive pattern, to which the auxiliary electrode is connected, formed thereon, wherein the auxiliary electrode is larger than the element electrode, the auxiliary electrode includes a step that makes a lower face smaller than the upper face, and an end portion of the auxiliary electrode on a side where the step is formed is located inside an outer peripheral side of the phosphor layer.

Preferably, in the above light-emitting device, the LED element includes two element electrodes on the bottom surface, the auxiliary electrode is provided for each of the two element electrodes, the conductive pattern on the mounting substrate is divided into two portions respectively connected to the two element electrodes, and a distance between the element electrodes, a distance between the auxiliary electrodes, and a distance between the portions of the conductive pattern coincide with one another.

Further, provided is a method for manufacturing an LED package, including the steps of disposing at least one metallic piece, which includes an upper face larger than an element electrode formed on a bottom surface of an LED element and a step that makes a lower face smaller than the upper face, on a substrate where at least one recess having the same shape as the metallic piece is formed, housing the metallic piece in the recess by vibrating the substrate, mounting the LED element on the metallic piece housed in the recess such that the metallic piece is connected, as an auxiliary electrode, to the element electrode of the LED element, wherein the LED element has a top surface and a side surface which are covered by a phosphor layer containing a phosphor, and the LED element including the phosphor layer has a width larger than a width of the metallic piece, and removing the LED element, to which the auxiliary electrode is connected, from the substrate.

Preferably, in the above method, the at least one metallic piece includes a plurality of metallic pieces, the at least one recess includes a plurality of recesses, in the disposing step, the plurality of metallic pieces are disposed on the substrate where the plurality of recesses are formed, and in the mounting step, the LED element is mounted on each of the metallic pieces housed in the recesses.

According to the present invention, an LED package used in a light-emitting device is provided with a function of position correction in mounting by self-alignment, and mounting density of such LED packages is increased.

DETAILED DESCRIPTION OF EMBODIMENTS OF THE INVENTION

Hereinafter, with reference to the accompanying drawings, an LED package, a light-emitting device, and a method for manufacturing an LED package will be explained in detail. However, it should be noted that the present invention is not limited to the drawings or the embodiments described below.

Figure 1:
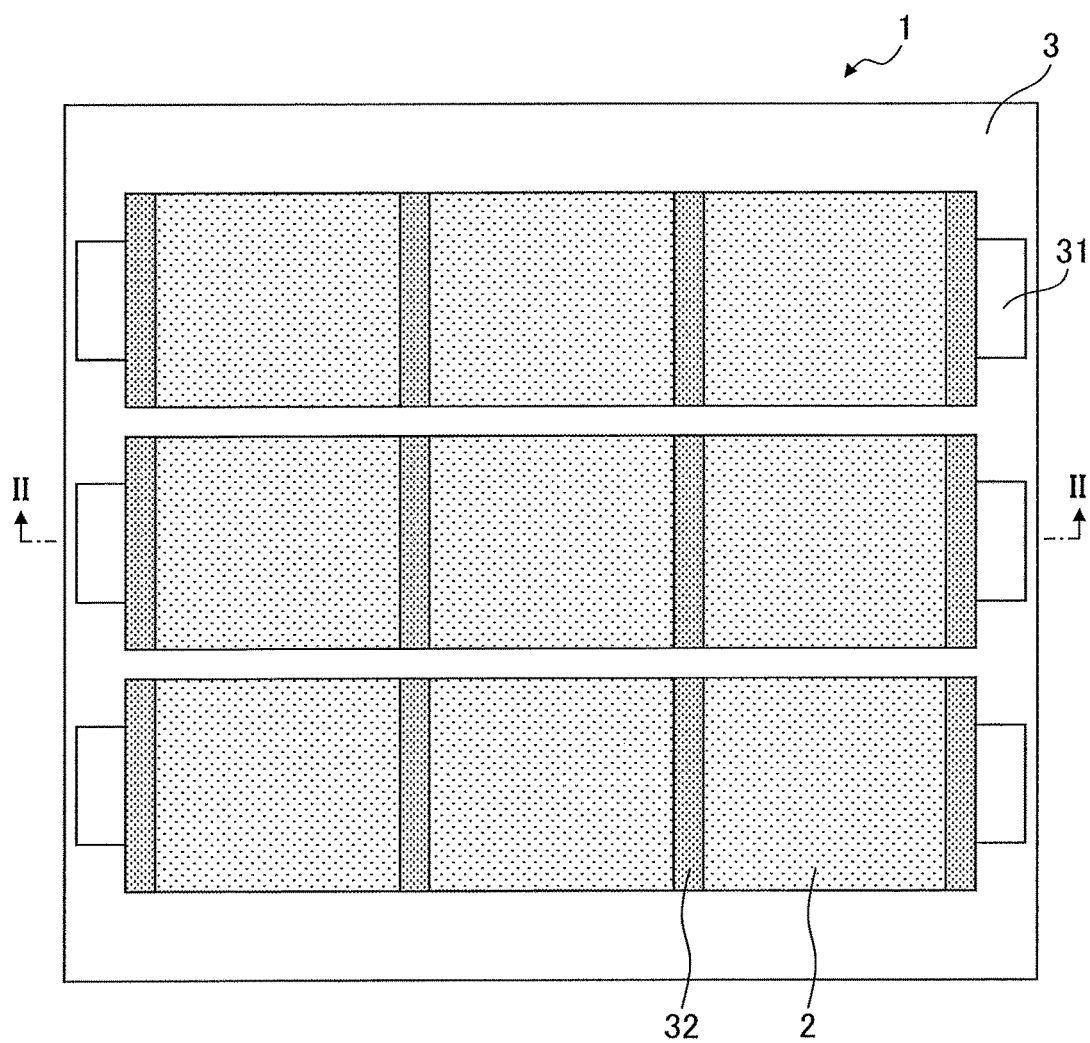
FIG. 1 is a top view of a light-emitting device 1.

FIG. 1 is a top view of a light-emitting device 1. The light-emitting device 1 corresponds to a light-emitting unit in various lighting apparatuses such as an LED for lighting and an LED bulb, and includes a plurality of LED packages 2 and a mounting substrate 3 as principal components. The plurality of LED packages 2 are mounted on the mounting substrate 3 in a tightly packed manner (at narrow intervals). FIG. 1 illustrates an example where nine LED packages 2 are mounted in a 3×3 lattice shape.

Figure 2:
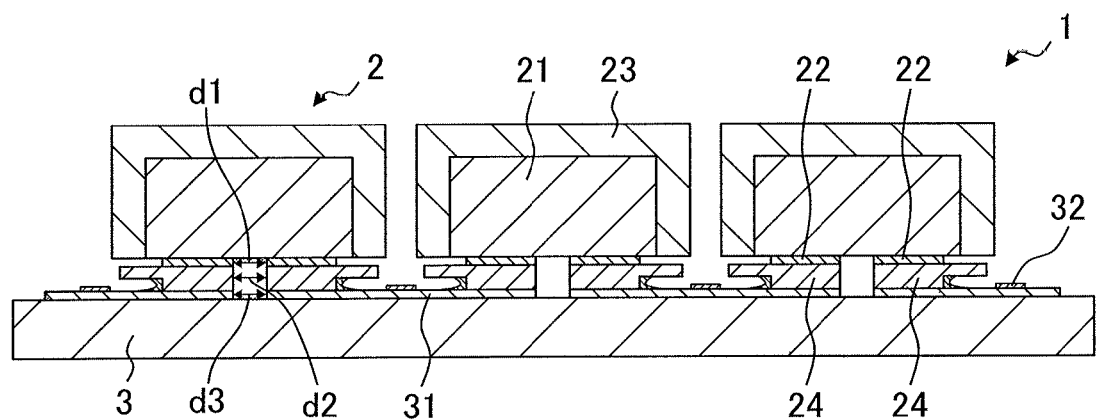
FIG. 2 is a sectional view of the light-emitting device 1 taken along line II-II in FIG. 1.
Figure 3:
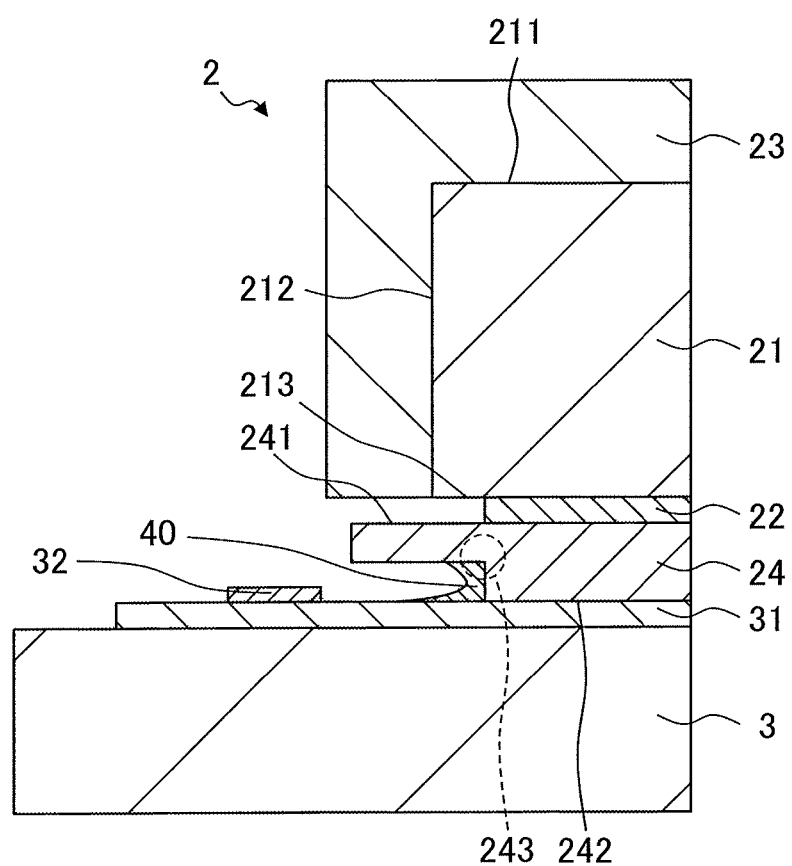
FIG. 3 is an enlarged sectional view of the light-emitting device 1.
Figure 4:
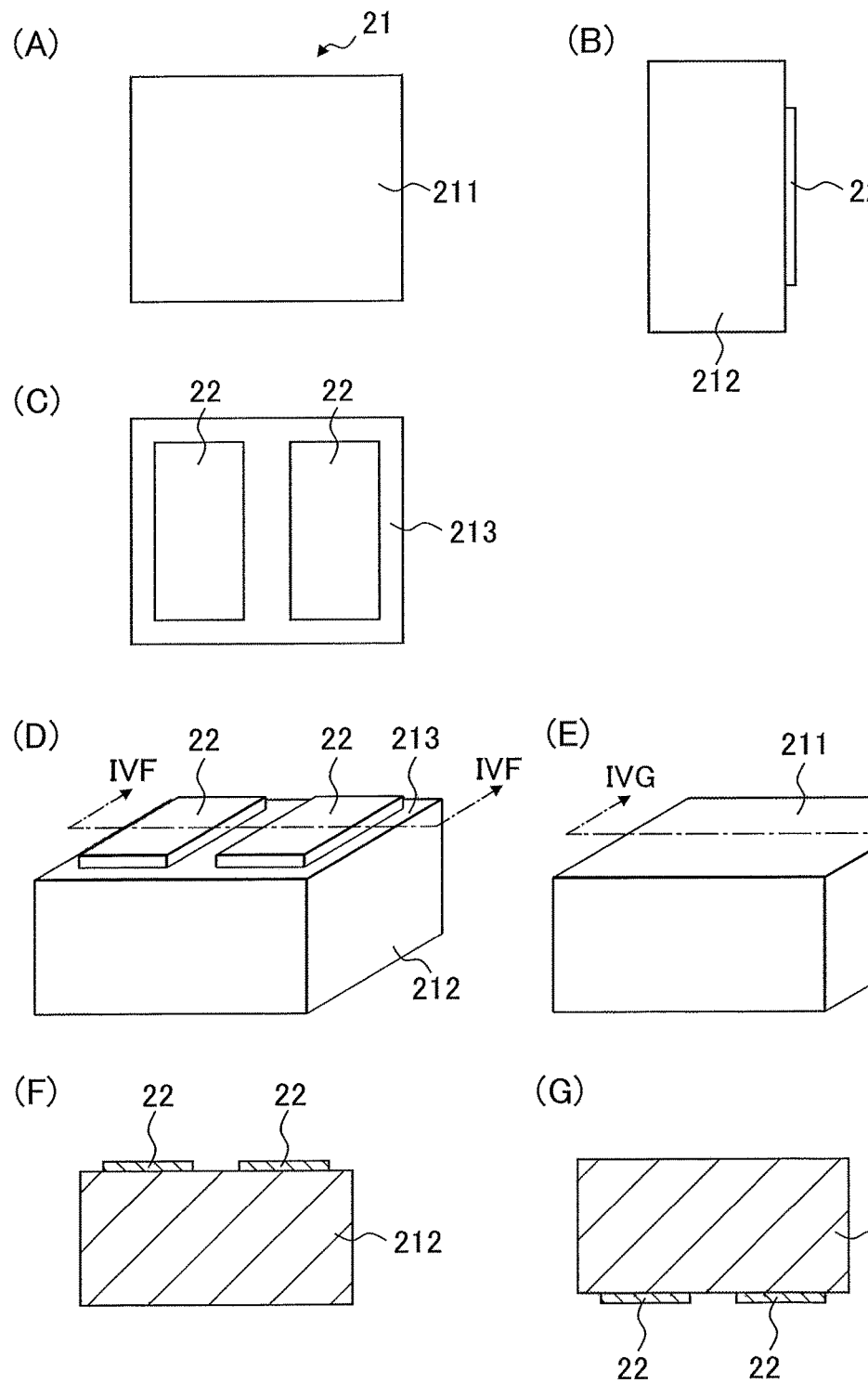
FIGS. 4(A) to 4(G) are diagrams illustrating the shape of the LED element 21.
Figure 5:
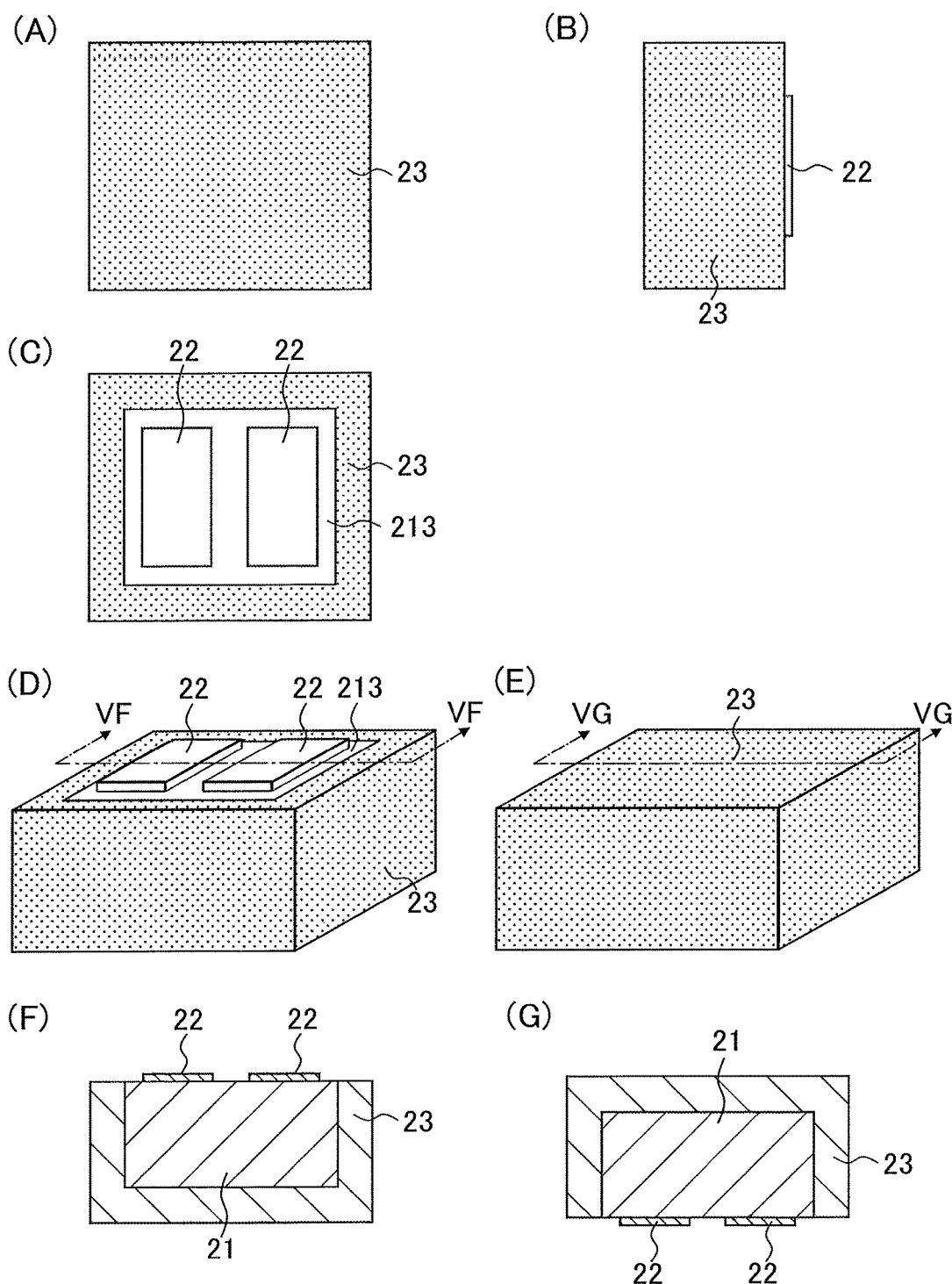
FIGS. 5(A) to 5(G) are diagrams illustrating the shape of the LED element 21 attached with the phosphor layer 23.
Figure 6:
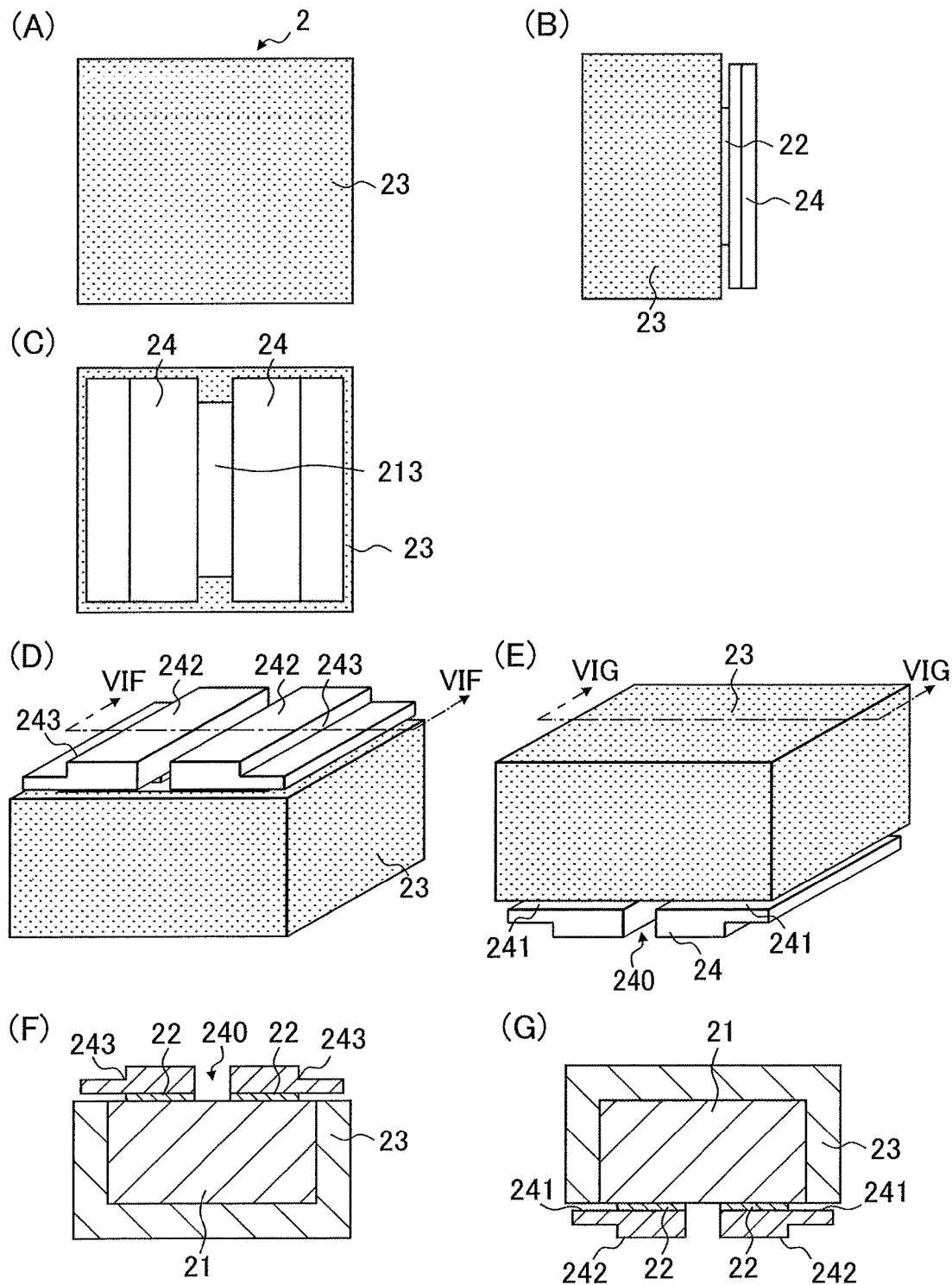
FIGS. 6(A) to 6(G) are diagrams illustrating the shape of the LED package 2 further attached with the auxiliary electrodes 24.

FIG. 2 is a sectional view of the light-emitting device 1 taken along line II-II in FIG. 1. FIG. 3 is an enlarged sectional view of the light-emitting device 1. FIG. 2 illustrates the cross-sections of the mounting substrate 3 and three out of the nine LED packages 2 included in the light-emitting device 1. FIG. 3 is an enlarged view of the left-end portion in FIG. 2.

Each of the LED packages 2 includes an LED element 21 provided with element electrodes 22, a phosphor layer 23, and auxiliary electrodes 24. The LED package 2 is a bump-type light-emitting element having the auxiliary electrodes 24, which are bumps for flip chip bonding, formed on the element electrodes 22 located at the bottom surface of the LED element 21. The following will first describe components of the LED package 2 with reference to FIGS. 4(A) to 6(G).

FIGS. 4(A) to 4(G) are diagrams illustrating the shape of the LED element 21. FIGS. 4(A), 4(B), and 4(C) are respectively a top view, a side view, and a bottom view of the LED element 21. FIG. 4(D) is a perspective view of the LED element 21 with the bottom surface 213 thereof facing upward, i.e., upside down, while FIG. 4(E) is a perspective view of the LED element. 21 with the top surface 211 thereof facing upward. FIG. 4(F) is a sectional view of the LED element 21 taken along line IVF-IVF in FIG. 4(D), while FIG. 4(G) is a sectional view taken along line IVG-IVG in FIG. 4(E).

The LED element 21 is, for example, a blue semiconductor light-emitting element (blue LED) that emits blue light having an emission wavelength range of approximately 450 to 460 nm. The LED element 21 includes two (a pair of) rectangular element electrodes 22 at positions symmetrical to each other with respect to the center of the bottom surface 213. While the illustrated LED element 21 has a shape of a cuboid (boxy shape), the shape of the LED element may be any shape such as a cylinder or an octagonal prism.

FIGS. 5(A) to 5(G) are diagrams illustrating the shape of the LED element 21 attached with the phosphor layer 23. FIGS. 5(A), 5(B), and 5(C) are a top view, a side view, and a bottom view corresponding to FIGS. 4(A), 4(B), and 4(C), respectively. FIGS. 5(D) and 5(E) are perspective views respectively corresponding to FIGS. 4(D) and 4(E). FIG. 5(F) is a sectional view taken along line VF-VF in FIG. 5(D), while FIG. 5(G) is a sectional view taken along line VG-VG in FIG. 5(E).

The phosphor layer 23 is made of, for example, colorless and transparent resin such as epoxy resin or silicone resin mixed with phosphor particles (not illustrated) dispersed therein. The phosphor layer 23 evenly covers the top surface 211 and the side surfaces 212 (see FIGS. 4(A) to 4(G)) of the LED element 21. In other words, the phosphor layer 23 covers the entire LED element 21 except the bottom surface 213 having the element electrodes 22 formed thereon. The end portions of the phosphor layer 23 are aligned at respective sides of the bottom surface 213 of the LED element 21, and the bottom surface 213 and the element electrodes 22 are exposed in the center of the bottom surface 213. The phosphor layer 23 preferably contains phosphor particles at an even concentration and covers each surface of the LED element 21 except the bottom surface 213 with a uniform thickness.

The phosphor layer 23 contains, for example, a yellow phosphor. The yellow phosphor is a particulate phosphor material such as YAG (yttrium aluminum garnet), which absorbs blue light emitted from the LED element 21 and performs wavelength conversion to generate yellow light. The LED package 2 emits white light obtained by mixing blue light from the LED element 21, which is a blue LED, and yellow light obtained by exciting the yellow phosphor using the blue light.

Alternatively, the phosphor layer 23 may contain a plurality of different types of phosphors such as a green phosphor and a red phosphor. The green phosphor is a particulate phosphor material such as $(BaSr)_2SiO_4:Eu^{2+}$, which absorbs blue light emitted from the LED element 21 and performs wavelength conversion to generate green light. The red phosphor is a particulate phosphor material such as $CaAlSiN_3:Eu^{2+}$, which absorbs the blue light emitted from the LED element 21 and performs wavelength conversion to generate red light. In this case, the LED package 2 emits white light obtained by mixing the blue light from the LED element 21, which is a blue LED, and green light and red light respectively obtained by exciting the green phosphor and the red phosphor using the blue light.

Alternatively, the phosphor layer 23 of each LED package 2 may contain different phosphors. In this case, the light-emitting device 1 as a whole may generate light of a preferred color according to the usage by mixing different colors of emitted light from the respective LED packages 2.

FIGS. 6(A) to 6(G) are diagrams illustrating the shape of the LED package 2 further attached with the auxiliary electrodes 24. FIGS. 6(A), 6(B), and 6(C) are a top view, a side view, and a bottom view corresponding to FIGS. 4(A), 4(B), and 4(C), respectively. FIGS. 6(D) and 6(E) are perspective views respectively corresponding to FIGS. 4(D) and 4(E). FIG. 6(F) is a sectional view taken along line VIF-VIF in FIG. 6(D), while FIG. 6(G) is a sectional view taken along line VIG-VIG in FIG. 6(E).

The auxiliary electrodes 24 are formed of two (a pair of) metallic pieces respectively corresponding to the two element electrodes 22, and serve as electrodes for soldering in fixing the LED package 2 on the mounting substrate 3. Upper faces 241 of the pair of auxiliary electrodes 24 are respectively attached to the lower faces of the corresponding element electrodes 22 in parallel to each other so as to sandwich the strip-shaped area (gap portion 240) between the pair of element electrodes 22 in the center of the bottom surface 213 of the LED element 21. In the gap portion 240 between the pair of auxiliary electrodes 24, the bottom surface 213 of the LED element 21 is exposed. Each of the auxiliary electrodes 24 is larger than the element electrode 22, though the area of the bottom surface covered by the pair of auxiliary electrodes 24 when the LED package 2 is viewed from below is smaller than the entire area of the bottom surface of the LED package 2. Furthermore, the auxiliary electrodes 24 are disposed such that the laterally outermost end portions thereof are located inside the outer peripheral sides of the phosphor layer 23. In other words, the auxiliary electrodes 24 are disposed such that the end portions thereof do not protrude from the phosphor layer 23 and the auxiliary electrodes 24 are not visible by being obscured by the phosphor layer 23 when the LED package 2 is viewed from above.

Each of the auxiliary electrodes 24 has a step 243 that makes the lower face 242 smaller than the upper face 241. The step 243 is formed in parallel to the gap portion 240 located between the pair of auxiliary electrodes 24. In other words, the auxiliary electrodes 24 have a shape as if it is formed by scraping off the end portions, which is located on the outside of the two plate-like metallic pieces disposed in parallel to each other, in parallel to the gap portion between the metallic pieces such that each of the end portions located on the outside is thinner than the corresponding end portion located on the inside. Due to the presence of the step 243, the inner end portions of the auxiliary electrodes 24 facing the gap portion 240 are one level thicker than the outer portions, and the lower face 242, which is on the side in contact with the mounting substrate 3, is smaller than the upper face 241 on the LED element 21 side.

The mounting substrate 3 will be described next with reference to FIGS. 1 and 2. The mounting substrate 3 is an insulating substrate such as an epoxy glass substrate, a BT resin substrate, a ceramic substrate, or a metal core substrate. On the upper face of the mounting substrate 3, conductive patterns 31 are formed to which the auxiliary electrodes 24 of the plurality of LED packages 2 are connected. On the upper faces of portions of each conductive pattern 31, which portions are not obscured by the LED packages 2, resists 32 are formed except at portions on the left and right end sides of the mounting substrate 3 in FIG. 1.

The conductive patterns 31 are formed in three lines corresponding to the LED packages 2 disposed in a 3-by-3 array in the lateral direction in FIG. 1. As illustrated in FIG. 2, each line of the conductive patterns 31 has gaps under the LED packages 2, each of which separates a portion to which one auxiliary electrode 24 of each LED package 2 is connected from a portion to which the other auxiliary electrode 24 is connected. As illustrated in FIG. 2, a distance d1 between the element electrodes 22 of the LED package 2, a distance d2 between the auxiliary electrodes 24 of the LED package 2, and a distance d3 between the portions of the conductive pattern 31 of the mounting substrate 3 coincide with one another. The three LED packages 2 in each line are connected in series, and application of voltage to the light-emitting device 1 by connecting the conductive patterns 31 on the left and right end sides of the mounting substrate 3 in FIG. 1 to an external power supply causes the light-emitting device 1 to emit light.

Since the auxiliary electrodes 24 are provided, the self-alignment effect is achieved when each LED package 2 is mounted on the mounting substrate 3. Accordingly, even if the LED package 2 is disposed a little shifted from a regular position on the mounting substrate 3, misalignment of the position will be automatically corrected.

In addition, as the step 243 is formed on each auxiliary electrode 24, solder 40 for fixing the LED package 2 to the mounting substrate 3 fits between the conductive pattern 31 on the mounting substrate 3 and the step 243 of the auxiliary electrode 24, as illustrated in FIG. 3. As a result, the solder 40 will not spread outside into the gap portion 240 located inside the pair of auxiliary electrodes 24 and the solder 40 will not come into contact with the element electrodes 22 of the LED element 21, thus the element electrodes 22 will not be eroded by the solder 40. Besides, due to the presence of the auxiliary electrodes 24, the possibility of flux, which has become hot during reflow, penetrating into the interface between the LED element 21 and the phosphor layer 23 is reduced, and thus an effect of protecting the LED package 2 is also achieved.

In addition, as the auxiliary electrodes 24 extend laterally within a range such that they do not protrude from the phosphor layer 23, the auxiliary electrodes 24 do not obstruct mounting a plurality of LED packages 2 in proximity to each other on the mounting substrate 3. Therefore, it is possible in the light-emitting device 1 to mount a plurality of bump-type LED packages 2 in a tightly packed manner. As a result, a property of color mixture of light emitted from the plurality of LED packages 2 is improved.

Figure 7:
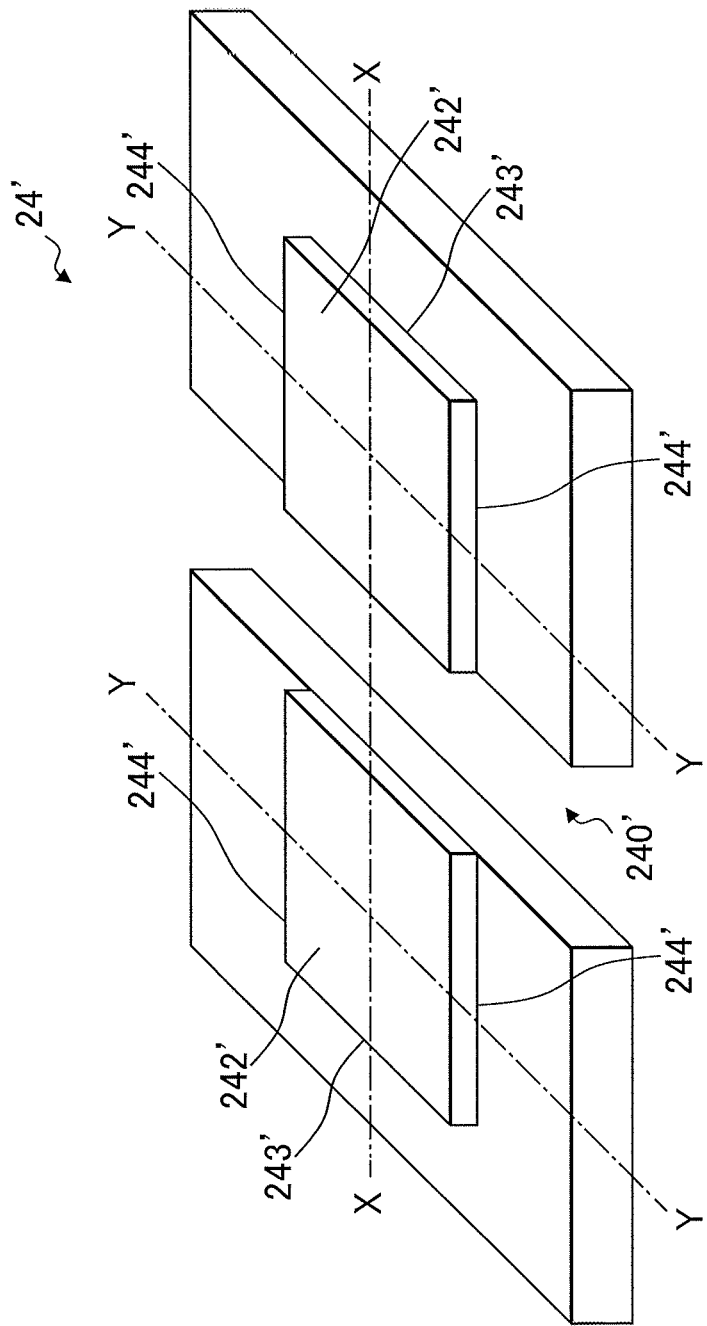
FIG. 7 is a perspective view illustrating the shape of auxiliary electrodes 24'.

FIG. 7 is a perspective view illustrating the shape of auxiliary electrodes 24'. FIG. 7 illustrates the auxiliary electrodes 24' in a state in which the lower faces 242' face upward. Each auxiliary electrode 24 as described hitherto has the step 243 formed only in one direction perpendicular to the gap portion 240; however, this step may be formed in both longitudinal and lateral directions of the box-shaped LED element 21. Each of the auxiliary electrodes 24' illustrated in FIG. 7 has a step 243' formed in an X direction, which is perpendicular to the gap portion 240', and steps 244' formed in a Y direction, which is parallel to the gap portion 240'. Other than the steps, the characteristics relating to the shape and the size of the auxiliary electrodes 24' are the same as those of the auxiliary electrodes 24. By forming the steps 243' and 244' in two directions in this manner, the area of the lower face 242' on the side in contact with the mounting substrate 3 may be even smaller than the area of the upper face on the LED element 21 side. Accordingly, the self-alignment effect and the effect of preventing the solder 40 from spreading outside described above are improved.

Figure 8:
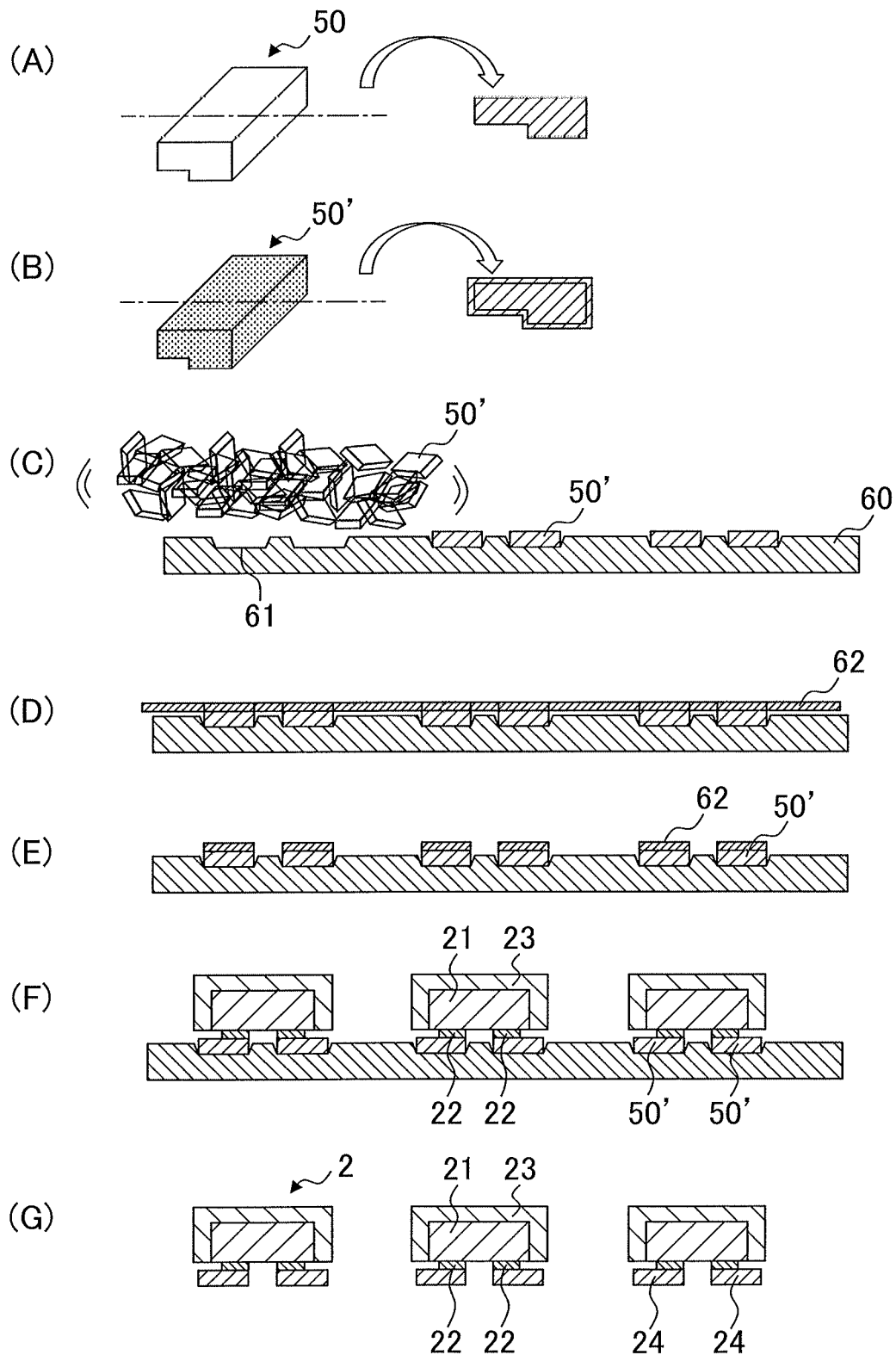
FIGS. 8(A) to 8(G) are diagrams for describing a manufacturing process of the LED packages 2.

FIGS. 8(A) to 8(G) are diagrams for describing a manufacturing process of the LED packages 2. At the time of manufacture of the LED packages 2, small metallic pieces 50, which will be auxiliary electrodes 24, are prepared first as illustrated in FIG. 8(A). Each metallic piece 50 is, for example, made of copper and is a plate-like member whose upper face has a size of approximately 0.5 mm×1 mm. Though FIGS. 8(A) to 8(G) do not illustrate the details, the metallic pieces 50 are not simple cuboids. Each metallic piece 50 has a lower face smaller than the upper face and a step of the same shape as that of the auxiliary electrode 24 described above. As illustrated in FIG. 8(B), the metallic pieces 50 are plated with Sn (by way of barrel plating) in advance, which result in metallic pieces 50'.

Next, as illustrated in FIG. 8(C), a substrate 60 is prepared on which recesses 61 having the same shape as the metallic pieces 50' are formed, and the metallic pieces 50' are disposed on the substrate 60. The substrate 60 is then vibrated, thereby causing the metallic pieces 50' to be housed in the recesses 61. As each metallic piece 50' has a step formed thereon, the shapes of upper and lower faces thereof are different. Therefore, if the shape of the recesses 61 is configured to match the shape of the metallic pieces 50', the metallic pieces 50' will not be housed in the recesses 61 upside down, and it is possible to dispose the metallic pieces 50' with the upper faces thereof facing upward.

Subsequently, as illustrated in FIG. 8(D), solder 62 is printed on the substrate 60 where the metallic pieces 50' are housed in the recesses 61 thereof. In this manner, as illustrated in FIG. 8(E), there is formed the solder 62 for bonding the metallic pieces 50' to the element electrodes of LED elements, on the upper faces of the metallic pieces 50'.

Then, as illustrated in FIG. 8(F), on each metallic piece 50', there is disposed the LED element 21, the top surface and the side surfaces of which are covered by the phosphor layer 23 containing phosphors and the width including the phosphor layer 23 of which is larger than the width of the metallic piece 50. Each LED element 21 is disposed such that the element electrodes 22 formed on the bottom surface thereof are placed on the metallic pieces 50', and fixed to the metallic pieces 50' with the solder 62. Accordingly, with two metallic pieces 50' composing a pair, a plurality of LED elements 21 are mounted on the metallic pieces 50' housed in the recesses 61.

Lastly, as illustrated in FIG. 8(G), the LED elements 21, to which the metallic pieces 50' are connected, are removed from the substrate 60. Thus, the LED packages 2, in each of which the metallic pieces 50' as auxiliary electrodes 24 are connected to the element electrodes 22 of the LED element 21, are obtained.

The manufacturing process described above has an advantage that significantly reduces man-hours as the auxiliary electrodes 24 can be attached collectively to multiple LED elements 21.

The invention claimed is:

1. An LED package comprising:
    an LED element including two element electrodes on a bottom surface;
    a phosphor layer containing a phosphor and covering a top surface and a side surface of the LED element; and
    an auxiliary electrode provided for each of the two element electrodes, wherein each auxiliary electrode has an upper face bonded to a lower face of one of the two element electrodes, wherein
    the auxiliary electrodes are larger than the element electrodes,
    the auxiliary electrodes include a step that makes a lower face of the auxiliary electrodes smaller than the upper face,
    an end portion of the auxiliary electrodes on a side where the step is formed is located inside an outer peripheral side of the phosphor layer, and
    side faces of the auxiliary electrodes are exposed without being covered by the phosphor layer,
    wherein due to the step, an inner end portion of one auxiliary electrode facing the other auxiliary electrode is thicker than an opposite end portion of the one auxiliary electrode.

2. The LED package according to claim 1, wherein
    the LED element has a boxy shape, and
    the step of the auxiliary electrodes is formed in both longitudinal and lateral directions of the boxy shape.

3. A light-emitting device comprising:
    an LED element including two element electrodes on a bottom surface;
    a phosphor layer containing a phosphor and covering a top surface and a side surface of the LED element;
    an auxiliary electrode provided for each of the two element electrodes, wherein each auxiliary electrode has an upper face bonded to a lower face of one of the two element electrodes; and
    a mounting substrate having a conductive pattern, to which the auxiliary electrodes are connected, formed thereon, wherein
    the auxiliary electrodes are larger than the element electrodes,
    the auxiliary electrodes include a step that makes a lower face of the auxiliary electrodes smaller than the upper face,
    an end portion of the auxiliary electrodes on a side where the step is formed is located inside an outer peripheral side of the phosphor layer, and
    side faces of the auxiliary electrodes are exposed without being covered by the phosphor layer,
    wherein due to the step, an inner end portion of one auxiliary electrode facing the other auxiliary electrode is thicker than an opposite end portion of the one auxiliary electrode.

4. The light-emitting device according to claim 3, wherein
    the conductive pattern on the mounting substrate is divided into two portions respectively connected to the two element electrodes, and
    a distance between the element electrodes, a distance between the auxiliary electrodes, and a distance between the portions of the conductive pattern coincide with one another.

5. A method for manufacturing an LED package, comprising the steps of:
    disposing at least one metallic piece, which includes an upper face larger than an element electrode formed on a bottom surface of an LED element and a step that makes a lower face smaller than the upper face, on a substrate where at least one recess having the same shape as the metallic piece is formed;
    housing the metallic piece in the recess by vibrating the substrate;
    mounting the LED element on the metallic piece housed in the recess such that the metallic piece is connected, as an auxiliary electrode, to the element electrode of the LED element, wherein the LED element has a top surface and a side surface which are covered by a phosphor layer containing a phosphor, and the LED element including the phosphor layer has a width larger than a width of the metallic piece; and removing the LED element, to which the auxiliary electrode is connected, from the substrate.

6. The method according to claim 5, wherein the at least one metallic piece comprises a plurality of metallic pieces, the at least one recess comprises a plurality of recesses, in the disposing step, the plurality of metallic pieces are disposed on the substrate where the plurality of recesses are formed, and in the mounting step, the LED element is mounted on each of the metallic pieces housed in the recesses.

* * * * *